(12) United States Patent
Köppl et al.

(10) Patent No.: US 7,885,797 B2
(45) Date of Patent: Feb. 8, 2011

(54) METHOD FOR PRODUCTION OF A SYSTEM FOR REPRESENTATION OF AN ELECTRICAL NETWORK, AND USE OF THE METHOD

(75) Inventors: Heinz Köppl, Graz (AT); Peter Singerl, Villach (AT)

(73) Assignee: Infineon Technologies AG, Munich (DE)

( * ) Notice: Subject to any disclaimer, the term of this patent is extended or adjusted under 35 U.S.C. 154(b) by 888 days.

(21) Appl. No.: 11/445,668

(22) Filed: Jun. 2, 2006

(65) Prior Publication Data

US 2007/0005326 A1 Jan. 4, 2007

(30) Foreign Application Priority Data

Jun. 3, 2005 (DE) ........................ 10 2005 025 676

(51) Int. Cl.
*G06F 17/50* (2006.01)
(52) U.S. Cl. .............................. 703/13; 703/14; 703/15; 703/16; 716/2; 716/3; 716/4; 716/5; 381/98; 381/320; 381/61; 330/149; 330/2; 330/254; 330/295; 375/232; 375/147
(58) Field of Classification Search .................. 375/316; 330/149; 381/96
See application file for complete search history.

(56) References Cited

U.S. PATENT DOCUMENTS

2005/0031137 A1* 2/2005 Browning et al. ............. 381/96
2007/0063769 A1* 3/2007 Jelonnek ....................... 330/149
2008/0049871 A1* 2/2008 Yang et al. ................... 375/316

OTHER PUBLICATIONS

Nemeth et al. Identification of Volterra Kernels Using Interpolation IEEE Transaction on Instrumentation and Measurement, vol. 51, No. 4, Aug. 2002.*
John Tsimbinos and Kenneth V. Lever Input Nyquist Sampling Suffices to Identify and Compensate Nonlinear Systems IEEE Transactions on Signal Processing, vol. 46, No. 10, Oct. 1998.*
Domenico Mirrir et al. A Modified Volterra Series Approach for Nonlinear Dynamic Systems Modeling IEEE Transactions on Circuit and Systems-I; Fundamental Theory and Applications, vol. 49, No. 8, Aug. 2002.*
Pier Andrea Traverso et al. A Nonlinear Dynamic S/H-ADC Device Model Based on a Modified Volterra Series: Identification Procedure and Commercial CAD Tool Implementation IEEE Transactions on Instrumentation and Measurement, vol. 52, No. 4, Aug. 2003.*

(Continued)

*Primary Examiner*—Kamini S Shah
*Assistant Examiner*—Cuong V Luu
(74) *Attorney, Agent, or Firm*—Eschweiler & Associates, LLC

(57) ABSTRACT

One embodiment of the present invention is a method for producing a system for describing an electrical network. An output signal of the electrical network is sampled at a frequency that corresponds to the Nyquist criterion for the input signal to the electrical network. A model with a memory is developed for the output signal, which is sampled at a low sampling rate, with this model approximating the output signal. The model is then transformed by suitable interpolation to an interpolated model with a memory. The interpolation results in the model created in this way providing a good approximation to an output signal which is sampled at a high frequency. The resultant system can be used for predistortion.

14 Claims, 3 Drawing Sheets

OTHER PUBLICATIONS

Jozef G. Nemeth and Johan Schoukens Efficient Identification of Third Order Volterra Models Using Interpolation Techniques IEEE Instrumentation and Measurement, Technology Conference, Anchorage Alaska, May 21-23, 2002.*

"Generalized Sampling Theorem" Yang-Ming Zhu, IEEE Transactions on Circuits and Systems-II: Analog and Digital Signal Processing, vol. 39, No. 8, Aug. 1992, pp. 587 & 588.

"Sampling Requirements for Volterra System Identification", Walter A. Frank, IEEE Signal Processing Letters, vol. 3, No. 9, Sep. 1996, pp. 266-268.

"Volterra Kernel Interplation for System Modeling and Predistortion Purposes", Peter Singerl and Heinz Koeppl, Christian Doppler Laboratory for Nonlinear Signal Processing, Graz University of Technology, Austria, Date not available, 4 pgs.

* cited by examiner

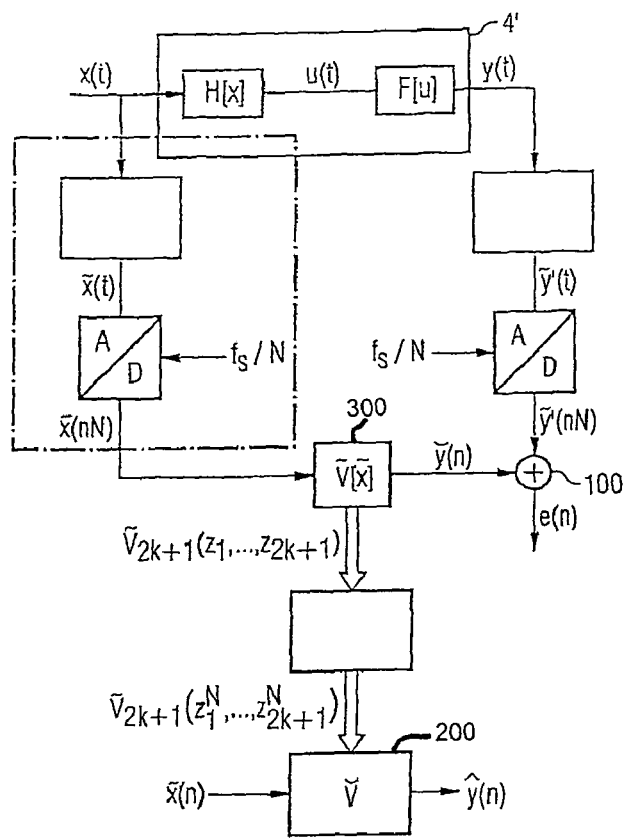
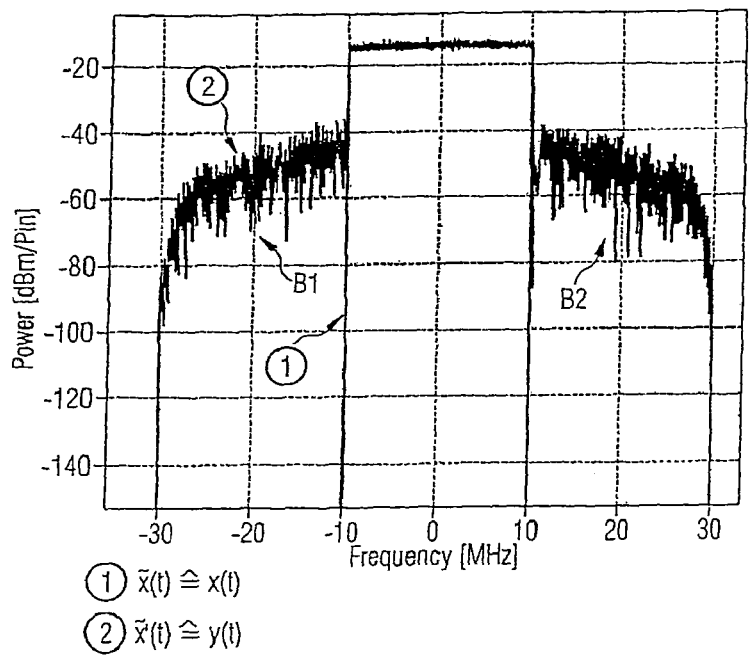

METHOD FOR PRODUCTION OF A SYSTEM FOR REPRESENTATION OF AN ELECTRICAL NETWORK, AND USE OF THE METHOD

REFERENCE TO RELATED APPLICATIONS

This application claims the benefit of the priority date of German application DE 10 2005 025 676.7, filed on Jun. 3, 2005, the contents of which are herein incorporated by reference in their entirety.

FIELD OF THE INVENTION

The invention relates to a method for production of a system for representation of an electrical network. The invention also relates to use of this method.

BACKGROUND OF THE INVENTION

The requirements for high data transmission rates for wireless mobile communication appliances have recently increased to a major extent. In order to satisfy the requirements, various mobile radio standards have been developed which use high-efficiency modulation and access methods. In this case, the data to be transmitted is modulated both in the phase and the amplitude of the carrier signal. Depending on the chosen modulation method and the mobile radio standard, this combined amplitude and phase modulation can lead to high peak power levels in the output signal. These peak power levels occur in particular in base stations whose transmission signals have to cover a specific area. The average required output power for coverage of a base station which is combined to form a so-called communication cell requires power amplifiers with a high output power of up to 200 W.

Since the power amplifiers are the most costly components in a base station, it is expedient to operate them in the region of their maximum efficiency. This region is close to the 1-dB compression point on the characteristic of the power amplifier. The expression the 1-dB compression point means that region of the characteristic in which the characteristic of the power amplifier differs by 1 dB from an advantageous characteristic. The discrepancy is equivalent to distortion.

From this region of the characteristic, the power amplifiers which are used for the base station have a very highly non-linear dynamic response. The expression a "non-linear dynamic response" of an electrical network means that the network changes an input signal that is supplied to it by a non-linear factor, that is to say a non-proportional value. The output signal from the electrical network thus contains components which are not proportional to the input signal. The expression "dynamic" in this case means a memory effect. An input signal which is supplied to the electrical network at a first time influences the transmission response of the electrical network at a later time.

The non-linear transmission response of the power amplifier and of further switching elements in the base station leads together with an input signal, part of which has a high amplitude modulation level and thus high peak power levels, to intermodulation and distortion in the output signal. The output signal spectrum is thus broadened. Additional signal components in adjacent frequency ranges may, however, have a disturbing effect on signals there, and may lead to data errors. Modern mobile radio standards thus specify the power level which may be emitted into adjacent frequency ranges.

In order to reduce the distortion and the spectral broadening, it would be possible to appropriately design the elements causing distortion in a base station and to operate them in a linear region of their characteristic. This solution is not desirable because of the large amount of space consumed and current drawn, as well as the poor efficiency. A further method is to suitably-distort the input signal. Predistortion compensates for and corrects the distortion caused by the non-linear transmission response, thus reducing the spectral broadening and possible data errors in output signals.

A digital predistorter is frequently used for predistortion. This is in general formed by a highly complex, non-linear system which likewise takes account of memory effects. In order to provide a suitable digital predistortion, the non-linear transmission response of the radio-frequency amplifier can be identified based on input/output signal measurements. If this response is known, it can be approximated by means of models for the description of the digital predistorter. The results obtained can be transferred to the predistorter.

For this purpose, both the input signal and the output signal are normally sampled at a high sampling rate, in order to cover the regions outside the useful signal. These regions contain the signal components and distortion caused by the non-linear transmission response. If the overall signal bandwidth is $B_{out}=N*B_{in}$, where $B_{in}$ represents the input signal bandwidth and N the highest order of non-linearity occurring in the power amplifier, the sampling rate is typically in the region of several hundred megasamples/second.

Thus, by way of example, the sampling rate is normally 250 MS/s for an input signal bandwidth of 20 MHz for four WCDMA/UMTS signals or WLAN signals, taking into account the non-linearity of the power amplifier up to the fifth order. The analog/digital converters required for sampling are correspondingly expensive.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, the invention is based on identifying an electrical network by suitably evaluating the output signal emitted from it, and using this concept to develop a suitable model for describing the electrical network. In this embodiment, the invention provides for the output signal to be sampled at a relatively low sampling frequency. The sampling frequency is derived from the signal bandwidth of a signal to be fed into the electrical network, and is less than twice the value of the output signal bandwidth that is required for complete coverage of all non-linearities. In this embodiment, to unambiguously describe the electrical network, it may be sufficient to sample the output signal at a frequency that satisfies the Nyquist theorem for the input signal to the electrical network.

The sampled output signal and the input signal are used to create a system and a model, and the model is matched to the transmission response of the electrical network such that it produces as an output signal an output signal which is similar to the output signal sampled at the low frequency. Individual parameters in the model are suitably modified for this purpose. A system is thus produced by approximation which produces from the input signal a signal that is very similar to or approximately matches the sampled signal.

The resultant system can be interpolated in order to take account of the spectral components produced by the non-linearities. The interpolated new system then approximates the electrical network with its non-linear transmission response, and can be used for the calculation of predistortion coefficients in a predistorter.

The lower sampling rate and the subsequent interpolation of the system with a memory which is produced from the lower sampling rate make it possible to considerably reduce the requirements for analog/digital converters. The analog/digital converter can thus be designed for the sample process at a low sampling rate. In one embodiment, this can correspond at least to twice the value of the input signal bandwidth. At the same time, this still ensures that the non-linear components in the transmission response of the electrical network are taken into account.

In one embodiment, a method for producing a system for description of an electrical network comprises the steps of providing an electrical network having an input for supplying an input signal with an input signal bandwidth. A first system with a memory is then allocated to the electrical network. The input signal is supplied to the electrical network, and an output signal is thus produced with an output signal bandwidth. The output signal is then sampled at a frequency which is derived from the input signal bandwidth and satisfies the Nyquist theorem for the input signal. It may be less than twice the value of the output signal bandwidth. Furthermore, a second system with a memory is provided, and is supplied with a signal derived from the input signal. The processing in the second system with a memory results in the producing an output signal which is compared with the sampled output signal from the electrical network. Parameters of the second system with a memory can be modified or adjusted as a function of this, thus advantageously providing the second system with a memory. The parameters of the second system with a memory are thus expediently set so as to limit the error between the output signal emitted from the system with a memory and the sampled output signal.

In one embodiment, a system with a memory such as this suitably models the transmission response of the electrical network for the low sampling rate. The parameters and/or the second system with a memory are/is then transmitted to a first system with a memory. This is done in a suitable form by interpolation for correction of the low sampling rate and consideration of the signal components outside the useful signal spectrum in the output signal of the electrical network. The first system with a memory determined in this way represents a model of the electrical network and can be used for further applications, preferably for the determination of pre-distortion coefficients, in an efficient manner. The interpolation results in the first system with a memory created in this way providing a very good approximation for an output signal sampled at a high frequency.

Various models can be used to represent the first and the second system with a memory. For example, the first and the second system with a memory can be described by a representation by means of a Volterra series. These represent a straightforward form and also include further suitable models for description of electrical networks, such as the Wiener model, the Hammerstein model, the parallel Wiener model and models with purely steady-state non-linearities, for example AM/AM or AM/PM distortion. Accordingly, one refinement provides a system which takes account of purely steady-state non-linearities. The method according to one embodiment of the invention is independent of the model which is used to represent and approximate the electrical network.

In various embodiments, an operator is set up to represent the system with a memory, in the form of a sum of a number of individual terms. The number of terms indicates the order of non-linearity, which is equal to an order of the non-linear transfer function of the electrical network. This operator is approximated in a region of a system bandwidth of the second system with a memory, by development of the individual terms using suitable functions. In one embodiment, the second system with a memory is represented by a Volterra series with a number of Volterra cores. These are developed in the frequency domain by functions, in particular by polynomials which are orthogonal in the region of the input signal bandwidth. The Volterra cores which have been developed in this way are then transformed back to the time domain. Orthogonal polynomials, Legendre polynomials, Chebeyshev polynomials, Fourier series, radial base functions or multiple layer perceptrons can be used for the development of the Volterra cores.

The resultant second system with a memory comprises a linear dynamic initial filter with a number of adjustable parameters and connected steady-state non-linearity for weighting of the signals which are emitted from the linear dynamic initial filter. The linear dynamic initial filter contains a plurality of delaying elements. An interpolation is carried out by varying the time delay of the elements included in the linear dynamic initial filter. This variation is carried out by a factor which is derived from the sampling frequency and the signal bandwidth of the input signal. The signal which has been modified in this way represents a model for description of the transmission response of the electrical network. The interpolation takes account of the non-linearities. The interpolation thus acts as if the output signal from the electrical network had been sampled at a sampling frequency that had been increased by that factor. It thus corrects the error resulting from the lower sampling rate.

This method accordingly makes it possible to develop a model for describing an electrical network, in which the sampling frequency for the output signal of the electrical network is lower than the sampling frequency required by the Nyquist theorem. The output signal which is sampled at a low sampling rate is used for determination of a first system with a memory. A second system with a memory can be created from this by interpolation and addition of suitable delaying elements, and provides a very good approximation to the transmission response of the electrical network. This second system with a memory is then used for determining predistortion coefficients.

The following description and annexed drawings set forth in detail certain illustrative aspects and implementations of the invention. These are indicative of but a few of the various ways in which the embodiments of the invention may be employed.

BRIEF DESCRIPTION OF THE DRAWINGS

The invention will be explained in detail in the following text using a number of illustrative embodiments and with reference to the drawings, in which:

FIG. 4 shows one system-theoretical illustration relating to determining a model to describe one electrical network according to one embodiment of the invention, FIG. 5 shows a power/frequency graph to show a spectrum of one input and output signal.

DETAILED DESCRIPTION

Figure 1:
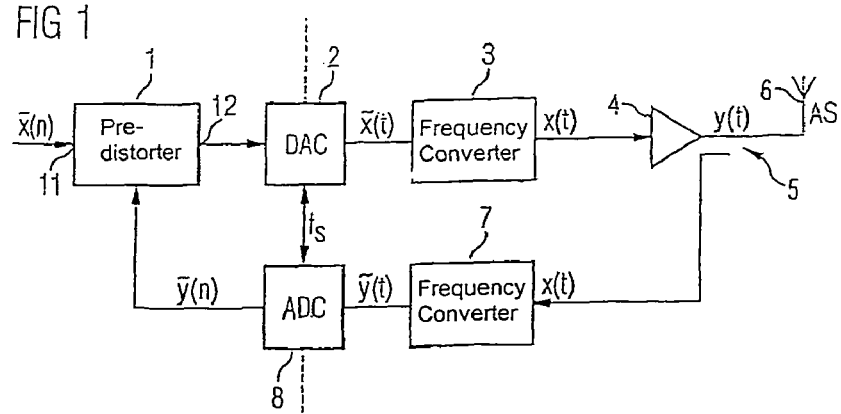
FIG. 1 shows one embodiment of a transmission path with feedback for determining distortion coefficients.

FIG. 1 shows a block diagram of a transmission path in a base station. The transmission path has a digital predistortion unit 1 with a data input 11 as well as a data output 12. The data output 12 is connected via a digital/analog converter 2 to a frequency-converting device 3, which converts the signal x̃(t), which is now continuous, to a carrier frequency, and uses this to produce the signal x(t). This is supplied to a radio-frequency amplifier 4. The radio-frequency amplifier 4 amplifies the signal to be emitted, and applies it to an antenna 6, via which it is transmitted.

Owing to the non-linear transmission response in the analog signal processing chain and in particular in the radio-frequency amplifier 4, the power of the emitted output signal y(t) is not proportional to the input power or to the power of the continuous baseband signal x̃(t). FIG. 5 shows a comparison of the input signal spectrum, that is to say the continuous signal x̃(t) in the frequency domain, with the spectrum of the output signal.

In this case, an input signal x(t) on a carrier frequency was chosen as an example. The input signal has a limited bandwidth of 20 MHz. In addition to the actual useful signal, this spectrum of the output signal y(t), which has been normalized to the average power of the input signal, clearly shows additional signal components in the regions B1 and B2, which are referred to as adjacent channels. These are created by convolution of the signal which is supplied to the input side of the electrical network with itself. Their strength and signal bandwidth are dependent on the order and strength of the non-linearity in the electrical network and in the radio-frequency amplifier as shown in FIG. 1.

A reduction in the non-linear signal components in the spectrum of the output signal as shown in FIG. 5 can be achieved, for example, by means of suitable predistortion of the signal which is supplied to the radio-frequency amplifier 4. This predistortion is expediently not carried out with the continuous baseband signal x̃(t), but in the discrete time baseband signal x̃(n) by the predistorter 1. For predistortion such as this, the non-linear transmission response of the downstream components, in this case in particular the radio-frequency amplifier 4, are described as accurately as desired. The process of description of the radio-frequency amplifier 4, or in general of an electrical network, is also referred to as modeling or setting up a system or a model.

Figure 2:
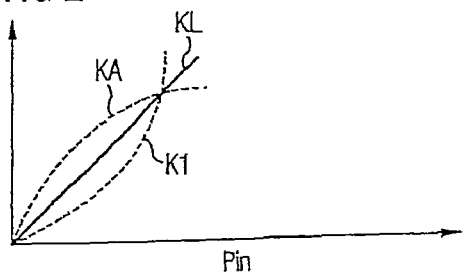
FIG. 2 shows sample characteristics of one electrical network and of a preamplifier for correction of the non-linearities of one electrical network.

Once a suitable model has been found to describe the transmission response, and the characteristic of the non-linear amplifier has been modeled as desired, this model can be used as a preamplifier, by inversion of its characteristic. In particular, parameters can be varied easily in this way, and can thus be matched to the real, time-dependent response of the electrical network. FIG. 2 shows one concept on which the preamplification is based.

FIG. 2 shows the characteristic KA of the power amplifier 4 as a function of the input signal power Pin. This clearly shows that the characteristic KA and thus the input/output signal response of the power amplifier depend on the input power Pin and differ considerably from an advantageous, linear characteristic KL. An amplifier with a transmission response according to the advantageous characteristic would not cause any distortion, or would cause only minor distortion, and could accordingly be operated highly efficiently. In order to obtain a transmission response corresponding to an advantageous characteristic KL, the input signal can be weighed with an appropriate factor. This factor can be determined by inversion of the characteristic KA. Inversion results in the characteristic Kl, which essentially represents the characteristic of the preamplifier 1. The appropriate predistortion coefficients can be derived from the factors.

For this purpose, in the transmission path shown in FIG. 1 a portion of the output signal that is emitted from the amplifier 4 is output by means of a directional coupler 5, and is converted in a demodulation unit 7 back to a continuous baseband signal ỹ(t). In addition to the actual useful signal, the baseband signal ỹ(t) now also contains the signal components which have been caused by the non-linear transmission response of the radio-frequency amplifier 4. The baseband signal ỹ(t) which has been converted back again is converted by an analog/digital converter 8 to a discrete-value signal ỹ(n), and is once again supplied to the predistortion unit 1. This uses this signal to determine a model which simulates the inverse transmission response of the power amplifier 4. The predistortion coefficients which can be determined from this are used to suitably predistort the baseband signal x̃(n) to be transmitted, and thus to correct the non-linearities in the radio-frequency amplifier 4.

The model describing the transmission response of the radio-frequency amplifier 4 and the model for determining the inverse transfer function may represent a complex problem. In particular, one can take account of the fact that electrical networks with a non-linear transmission response, for example radio-frequency amplifiers, frequently have a "memory". Their transmission response is thus not static, but is dynamic. This means that the output signal from an electrical network depends not only on the input signal at a specific concrete time, but also on the time profile of the input signal up to this specific time. In other words, the output signal is dependent on the time profile of the input signal. This situation can be taken into account when determining the predistortion coefficients.

In order to take account of all the non-linear components in the output signal to a sufficient extent, the frequency-converted, distorted baseband signal ỹ(t) can be suitably sampled. In order to detect all of the signal components caused by distortion in the distorted baseband signal ỹ(t), it has been necessary until now for the sampling frequency to be at least twice N-times the input signal bandwidth, where N indicates the order of the non-linearity of the radio-frequency amplifier. Twice the sampling rate can be used in order to satisfy the Nyquist criterion. In the case of fifth-order input signal bandwidths and non-linearities N=5, this leads to sampling rates in the region of 250 MS/s, and thus to very expensive and complex analog/digital converters.

Figure 3:
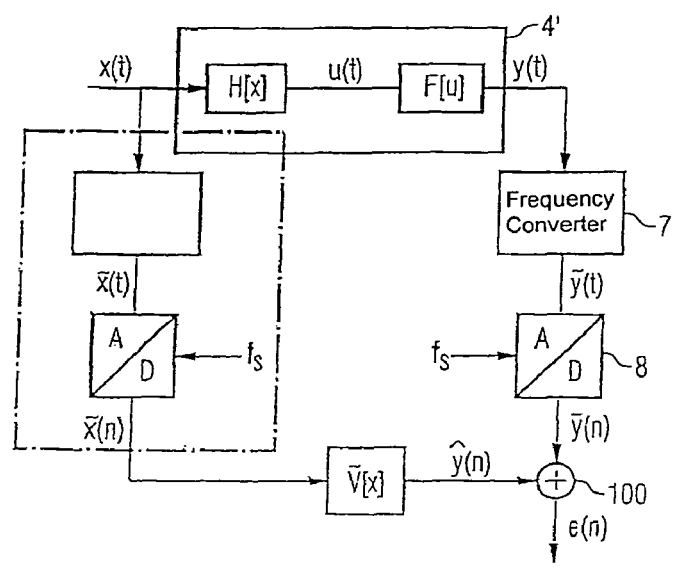
FIG. 3 shows one system-theoretical illustration relating to determining a model to describe an electrical network according to one embodiment of the invention.

FIG. 3 shows one known system-theoretical representation relating to the determination of a suitable model for description of an electrical network. This illustrated embodiment takes account of the fact that, subject to the precondition that the useful signal bandwidth B is considerably less than the carrier frequency $f_c$, $2B \ll f_c$, only the baseband signal quantities need be used for determining the model.

An electrical network 4' with a non-linear transmission response can thus be described by a system comprising a dynamic non-linearity, represented by the operator H[x], and a downstream dynamic filter, represented by the operator F[u]. A continuous-value signal x(t) supplied on the input side is in this representation processed by the operator H[x]. The output signal u(t) is represented by $$u(t) = H[x(t)] = \sum_{n=1}^{N} u_n(t), \tag{1}$$

where $u_n(t)$ forms individual components of the signal u(t). The individual components $u_n(t)$ can in turn be represented by n-th order Volterra cores $h_n(\tau_1 \ldots \tau_n)$ in the time domain.

$$u_n(t) = \int_0^\infty \ldots \int_0^\infty h_n(\tau_1, \ldots, \tau_n) \prod_{i=1}^{n} x(t - \tau_i) d\tau_i \tag{1a}$$

The downstream filter, represented by the linear operator F, at the same time suppresses the repetition spectra at multiples of the carrier signal. The output signal y(t) is thus given by:

$$y(t) = FH[x(t)] = \sum_{n=1}^{N} F[u_n(t)] \tag{2}$$

The output signal y(t) corresponds to the signal emitted from the amplifier 4 in FIG. 1. The output signal is once again frequency-converted and produces a baseband signal $\tilde{y}(t)$. Assuming that the frequency of the carrier signal is:

$f_c > B(2N-1)$, where 2B is the bandwidth of the bandpass signal x(t), a corresponding baseband-equivalent quantity $\tilde{y}(t)$ exists for the continuous output signal y(t). This can be represented from equation (2) as:

$$\tilde{y}(t) = \sum_{k=0}^{[N/2]-1} \int_0^\infty \ldots \int_0^\infty \tilde{h}_{2k+1}(\tau_1, \ldots, \tau_{2k+1}) \cdot \tag{3}$$

$$\prod_{i=1}^{k+1} \tilde{x}(t - \tau_i) \prod_{i=k+2}^{2k+1} \tilde{x}^*(t - \tau_i) d\tau_1 \ldots d\tau_{2k+1}.$$

The symbol * in the equation (3) denotes the complex conjugate of the baseband signal $\tilde{x}(t)$.

It is then converted to a digital signal $\tilde{y}(n)$. The analog/digital conversion is carried out using a sampling frequency $f_s$ which satisfies the Nyquist theorem for the baseband output signal $\tilde{y}(t)$. At the same time, in this exemplary embodiment, the continuous signal x(t) is converted to the baseband signal $\tilde{x}(t)$, and is likewise converted to a discrete-value baseband signal $\tilde{x}(n)$ using the same sampling frequency $f_s$.

The baseband signals $\tilde{x}(t)$ and $\tilde{y}(t)$ are in this case sampled using a sampling frequency $f_s > 2NB$. The factor N is chosen such that the sampling frequency is at least twice as great as the output signal bandwidth of the baseband output signal y(t). The overall spectrum of the output signal can thus be determined without any aliasing products or repeated spectra. The discrete-value signal $\tilde{x}(n)$ is now supplied to a model V[$\tilde{x}$] for description of the electrical network 4'. The model V[$\tilde{x}$] uses this to produce an approximated discrete-value output signal $\hat{y}(n)$.

The approximated output signal $\hat{y}(n)$ from the model V[$\tilde{x}$] can be represented by:

$$\hat{y}(n) = V[\tilde{x}(n)] = \sum_{k=0}^{[N/2]-1} \sum_{l_1=0}^{L_{2k+1}} \ldots \sum_{l_{2k+1}=0}^{L_{2k+1}} v_{2k+1}(l_1, \ldots, l_{2k+1}) \cdot \tag{4}$$

$$\prod_{i=1}^{k+1} \tilde{x}(n - l_i) \prod_{i=k+2}^{2k+1} \tilde{x}^*(n - l_i)$$

The model V[$\tilde{x}$] can accordingly be represented by a sum of individual so-called Volterra cores $v_{2k+1}$. The approximated output signal $\hat{y}(n)$ is supplied together with the sampled output signal $\tilde{y}(n)$ to a subtractor or comparator 100. A substractor 100 determines the error signal e(n) from the approximated output signal $\hat{y}(n)$ and the digital signal $\tilde{y}(n)$, and compares this with a limit value. Depending on the degree of approximation of the signal $\hat{y}(n)$, the error e(n) becomes very small. The error e(n) is minimized with respect to the discrete-time baseband Volterra cores $v_{2k+1}$ in equation 4 by varying individual parameters in the model V[$\tilde{x}$]. When the minimum error e(n) is reached, the transmission response of the model V[$\tilde{x}$] corresponds to the transmission response of the electrical network 4'. The model determined in this way can be inverted in an efficient manner, and used for predistortion of the continuous signal x(t).

The non-linear model in equation 4 represents a general model for description of non-linear electrical networks. This also covers the generally more streamlined models such as the Wiener model, the Hammerstein model or the parallel Wiener model. It likewise also covers models which are described by purely steady-state non-linearities, for example pure AM/AM and AM/PM conversions. A detailed explanation relating to the determination of a system for description of an electrical network is contained in German Patent Application No. 10 2005 020 318.3 whose contents are referred to here. This shows how the Volterra cores $v_{2k+1}$ can be developed with the aid of the representation of the output signal according to equation (3).

In practice, there is frequently already a digital baseband signal $\tilde{x}(n)$ in the signal processing chain. On the assumption that the signals $\tilde{x}(n)$ and $\tilde{x}(t)$ are equivalent, this can be used directly as the input signal $\tilde{x}(n)$ for the model V[$\tilde{x}$].

The embodiment which is known from FIG. 3 may be carried out such that the sampling frequency $f_s$ is chosen to be appropriately high in order to take account in particular of the components in the baseband output signal $\tilde{y}(t)$ which are caused by the non-linear transmission response of the electrical network 4'.

FIG. 4 shows a system-theoretical illustration of the method according to the invention, in which the relatively high sampling rates are reduced and a sufficient model can nevertheless be determined to describe the transmission response of the electrical network 4'. The same reference symbols denote components having the same effect and/or function.

As already mentioned, the output signal y(t) can be represented by the operators H and F. The output signal u(t) of the operator H is obtained from equation (1) with equation (1a), with the individual components $u_n(t)$ being represented in the time domain by n-th order Volterra cores $h_n(\tau_1 \ldots \tau_n)$. The downstream filter, represented by the linear operator F, suppresses the repeated spectra at multiples of the carrier signal.

In one embodiment, the transmission response of the electrical network 4' is now determined at a lower sampling rate. For this purpose, the input signal x(t) as well as the baseband output signal ỹ(t) from the electrical network 4' are not sampled at a frequency $f_s \geq 2NB$, but at a frequency $f'_s = f_s/N = 2B$. The sampling frequency $f'_s$ in the present example satisfies the Nyquist theorem for the bandwidth-limited baseband input signal x̃(t).

At least the bandwidth-limited baseband input signal x̃(t) can be detected completely in order to identify the transmission response of the electrical network 4'. Thus, the sampling frequency typically corresponds to at least twice the bandwidth of the input signal x̃(t).

Because the sampling rate for the output signal ỹ(t) is now lower, the discrete-value baseband output signal ỹ(n) that is produced contains repeated spectra. It is therefore no longer an equivalent representation of the continuous baseband signal ỹ(t). Nevertheless, it is possible to develop models which suitably approximate the electrical network 4' as shown in FIG. 4.

When a specific model V[x̃] such as this exists, its approximated output signal ŷ(n) can be the same as its sampled output signal y(nN) with repeated spectra applied to it. For this purpose, the approximated output signal ŷ(n) of the nonlinear discrete-time model V[x̃] in FIG. 3 is considered once again. In the situation where k=0, ..., [N/2]−1, the approximated output signal ŷ(n) can be covered in the time domain in 2k+1 discrete-time dimensions. In this case:

$$\hat{y}_{2k+1}(n_1, \ldots, n_{2k+1}) = \qquad (5)$$

$$\sum_{l_1=0}^{L_{2k+1}} \cdots \sum_{l_{2k+1}=0}^{L_{2k+1}} v_{2k+1}(l_1, \ldots, l_{2k+1}) \cdot \prod_{i=1}^{k+1} \tilde{x}(n_i - l_i) \prod_{i=k+2}^{2k+1} \tilde{x}^*(n_i - l_i).$$

In order to transform equation (5) to the frequency domain, a 2k+1 dimensional discrete Fourier transformation is carried out. This leads to a multiple-dimensional approximated frequency domain signal $\hat{Y}_{2k+1}$:

$$\hat{Y}_{2k+1}(\omega_1, \ldots, \omega_{2k+1}) = \qquad (6)$$

$$V_{2k+1}(\omega_1, \ldots, \omega_{2k+1}) \cdot \prod_{i=1}^{k+1} \tilde{X}(\omega_i) \prod_{i=k+2}^{2k+1} \tilde{X}^*(-\omega_i).$$

This is periodic in two π for all frequency variables $\omega_1, \ldots, \omega_{2k+1}$. The frequency domain signals X̃ and $v_{2k+1}$ represent the Fourier transforms of the input signal x̃(t) and, respectively, the Volterra cores in the time domain. In order to produce an output signal of order 2k+1 in the frequency domain, the inverse Fourier transformation is also applied once again to equation (6). This leads to:

$$\hat{Y}_{2k+1}(\omega) = \qquad (7)$$

$$\frac{1}{(2\pi)^{2k}} \int_{-\pi}^{\pi} \cdots \int_{-\pi}^{\pi} \hat{Y}_{2k+1}(\omega, \omega_1 - \omega_2, \omega_2 - \omega_3, \ldots, \omega_{2k}) d\omega_1 \ldots d\omega_{2k}.$$

As can be seen from equation (7), the distribution of the output signal in the frequency domain of the model V[x̃] as shown in FIG. 2 can be represented by convolution of the bandwidth-limited multiple-dimension frequency domain signals in the equation (6). This process produces the desired spectral broadening, which likewise exists in the continuous output signal y(t) or ỹ(t) from the electrical network. At the same time, the model determined in equation (7) is defined unambiguously by the Volterra cores within the input signal bandwidth. For this reason, the following condition is obtained for the Volterra cores in the frequency domain of the two models V̂[x̃] shown in FIG. 2 and FIG. 4:

$$V_{2k+1}(\omega_1, \ldots, \omega_{2k+1}) \equiv \tilde{V}_{2k+1}(N\omega_1, \ldots, N\omega_{2k+1}) \qquad (7a)$$

for all k within the input signal bandwidth of ±π/N. The Volterra cores $\tilde{V}_{2k+1}$, which have been identified with the aid of a low sampling rate as shown in FIG. 4, can have their frequencies scaled by a factor n. This scaling is carried out by efficient multidimensional filling of zeros.

The undesirable repeated spectra which are produced by this process are masked by the band-limited input signal X̃(ω). In the time domain, the filling process is achieved by replacing all of the "Unit Sample Delays" in the discrete-time model V̂[x̃] as shown in FIG. 4 by "N-Sample Delays". This process is also referred to as "Zero Padding" or as zero insertion. The newly resulted model V̌ as shown in FIG. 4 can accordingly be expressed by:

$$\tilde{V}_{2k+1}(z_1, \ldots, z_{2k+1}) = \tilde{V}_{2k+1}(z_1^N, \ldots, z_{2k+1}^N) \qquad (8)$$

where the $z_i$ indicate the frequency variables in the z domain for i=1, ..., 2k+1. The newly calculated cores in the frequency domain can be used to produce a new system for describing the transmission response of the electrical network. This can be used to generate the discrete-time approximated output signal ŷ(n) with the desired frequency components outside the useful signal bandwidth. The transformation or recalculation of the model V̂[x̃] determined using the low sampling rate into the model V̌ does not require any additional computation complexity or major hardware complexity. The required "Unit-Sample Delays" can be implemented by efficient memory as delay elements. The two determined models V̌ and V̂[x̃] can be provided by means of known dynamic initial filters and a downstream steady-state nonlinearity. Examples of this are described in German Patent Application No. 10 2005 020 318.3.

Figure 6:
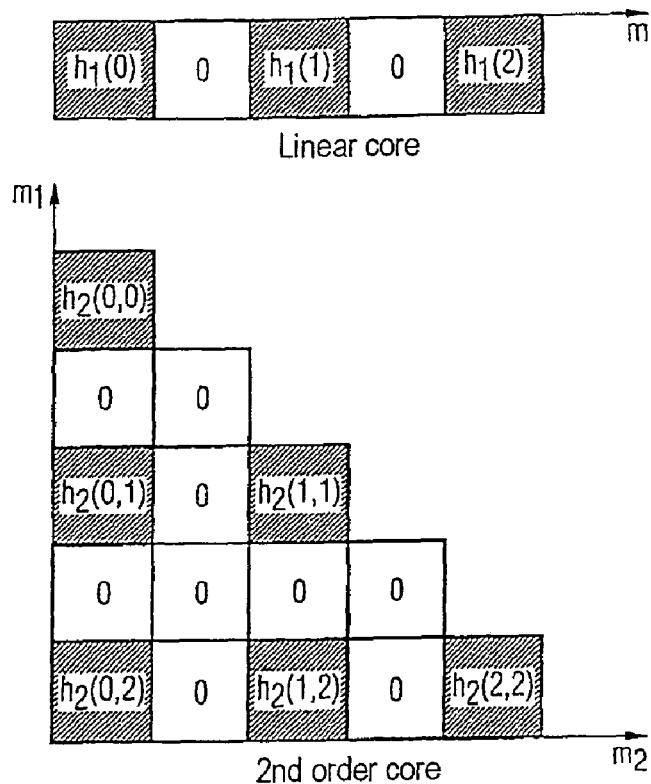
FIG. 6 illustrates one embodiment for the "Zero Paddings" in first and second order Volterra cores.

FIG. 6 shows an illustrative representation of the Volterra cores of the model V̂[x̃] developed for the low sampling frequency in comparison to the model V̌ after interpolation. The shaded cores each represent the Volterra cores for the first and second orders of the model V̂[x̃]. These are determined using the output signal ỹ(n).

In order to obtain the model V̌, an additional zero is inserted into each dimension between each core.

The various components of the system as described (and other systems as contemplated by those of ordinary skill in the art) include suitable circuitry, state machines, firmware, software, logic, etc. to perform the various methods and functions illustrated and described herein, including but not limited to the exemplary methods described below. While the methods illustrated below are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of systems which are illustrated and described herein as well as in association with other systems not illustrated, wherein all such implementations are contemplated as falling within the scope of the present invention and the appended claims.

The method described here can thus be used to determine a model for description of an electrical network in an efficient manner, without any need for high sampling rates for the individual model development. In fact, the output signal and the input signal are sampled at a frequency which corresponds essentially to the Nyquist criterion for the input signal. A model is thus developed which approximates an output signal to a good approximation to the output signal sampled at the lower sampling rate. The model developed in this way thus forms a transfer function which produces the output signal from the input signal sampled at the low sampling frequency, with this output signal corresponding to the output signal sampled at the low sampling rate. This model is optimized by comparison of the digital baseband output signal and of the sampled output signal, and subsequent processing, for example by means of a "Least Squares Fit". The model is then interpolated in order to correct the low sampling frequency again, and to obtain a model which accurately describes the transmission response of the electrical network.

Figure 7:
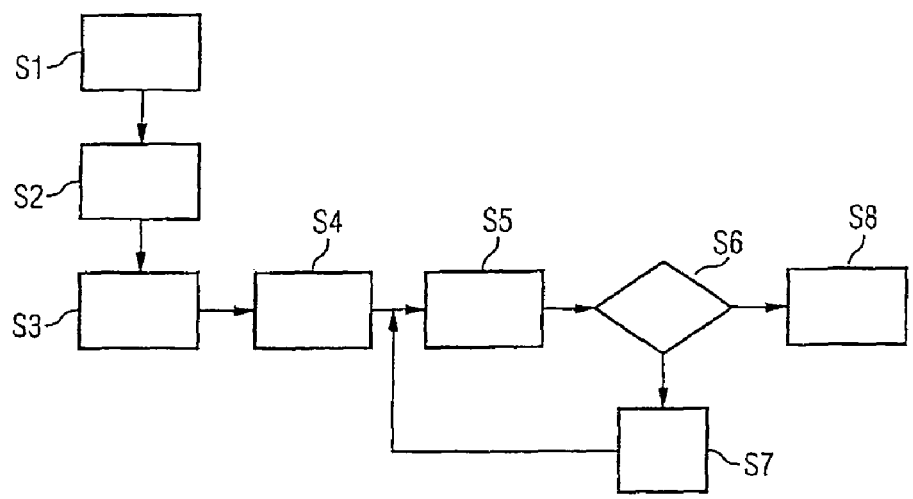
FIG. 7 shows one embodiment for a procedure for determination of a system.

FIG. 7 shows one embodiment of the method in the application for determining a suitable model for predistortion in a transmission path. In this case, it should be stressed that the method can be used for baseband signals as well as for signals at a carrier frequency, provided there is assurance that the bandwidth of the signal is small in comparison to the carrier frequency. As used further herein, the term baseband signal or digital baseband signal may include, but is not limited to: baseband signals as well as signals at a carrier frequency.

In a first step S1, an electrical network 4, 4' is provided which has a non-linear transmission response. The electrical network has an input to which a signal can be supplied. The signal has a bandwidth.

In step S2, a first system 200 with a memory, which may also be referred to as an interpolated model, is then allocated to the electrical network and a second system 300 with a memory ($\tilde{V}[\tilde{x}]$), which may also be referred to as a model, is provided. In step S3, a signal $\tilde{x}(nN)$ which is derived from the input signal $\tilde{x}(t)$, or the input signal itself, is supplied to the second system with a memory. The supplied signal is preferably a digital signal. The input signal $\tilde{x}(t)$ is likewise supplied to the electrical network.

In step S4, the electrical network processes the input signal $\tilde{x}(t)$ and uses it to produce an output signal $\tilde{y}(t)$. This output signal is sampled, and is converted to a digital signal $\tilde{y}(nN)$. The sampling frequency at which the conversion is carried out is at least twice the bandwidth of the input signal $\tilde{x}(t)$. In other words, the sampling frequency satisfies the Nyquist criterion for the input signal. Since the bandwidth of the output signal $\tilde{y}(t)$ is greater than the bandwidth of the input signal $\tilde{x}(t)$ because of the distortion caused by the non-linear transmission response of the electrical network, additional repeated spectra, so-called aliasing products, appear in the digital output signal $\tilde{y}(nN)$ after the conversion process.

In step S5, the approximated output signal $\tilde{y}(n)$ produced by the second system with a memory is compared with the signal $\tilde{y}(n)$ sampled at the low frequency, and an error $e(n)$ is determined from this. This error is compared in step S6 with a limit value. If the error is greater than the limit value, parameters of the model are varied in step S7. The input signal $\tilde{x}(n)$ is thus processed once again in the model, and an approximated output signal $\tilde{y}(n)$ is produced once again, and is compared with the signal $\tilde{y}(n)$. This process is repeated until the limit value is undershot.

When the error $e(n)$ is a minimum, the second system with a memory is approximated such that it produces the output signal sampled at the low sampling frequency from the input signal, to a good approximation. The model is now transformed in step S8 to the first system $\tilde{V}$ with a memory, in order to simulate the transmission response of the electrical network as accurately as possible. The model is interpolated for this purpose, with individual parameters being added to the second system with a memory. In detail, the "Unit Sample Delays" are replaced by n-times "Unit Sample Delays". The factor n is in this case derived from the ratio of the bandwidth of the output signal produced by the electrical network to the bandwidth of the input signal.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for producing a system for representation of an electrical network, comprising:
    providing the electrical network having an input and an output, wherein the electrical network has a non-linear transmission response;
    supplying an input signal to the input of the electrical network, wherein the input signal has an input signal bandwidth, and providing an output signal at the output of the electrical network, wherein the output signal has an output signal bandwidth;
    sampling the output signal at a frequency that is derived from the input signal bandwidth and is less than a value equal to twice the output signal bandwidth, thereby producing a sampled output signal;
    supplying a digital baseband signal to an initial model associated with the electrical network and producing a digital baseband output signal therefrom, wherein the digital baseband signal is derived from the input signal;
    comparing the digital baseband output signal with the sampled output signal and determining parameters to update said initial model to generate an updated model based on the comparison, wherein the determined parameters minimize an error between the digital baseband output signal output from the updated model and the sampled output signal; and
    generating an interpolated model based on the updated model by performing an interpolation operation on the updated model, wherein the interpolated model is for correction of the low sampling rate and consideration of the signal components outside the useful signal spectrum in the output signal of the electrical network.

2. The method as claimed in claim 1, wherein sampling the output signal of the electrical network is carried out at a frequency that corresponds at least to a value equal to twice the input signal bandwidth.

3. The method of claim 1, wherein the initial model is provided, and providing the initial model comprises:
setting up an operator in order to describe the model, with the operator being formed as a sum of a number of individual terms, and the number of terms indicating an order of non-linearity which corresponds to an order of the non-linear transfer function of the electrical network; and
approximating the operator in the region of the system bandwidth of the model, by development of the terms with functions.

4. The method of claim 1, wherein supplying the digital baseband signal comprises at least one of the following:
sampling the input signal at a frequency that corresponds at least to twice the input signal bandwidth; and
sampling the input signal at the sampling frequency for the output signal.

5. The method of claim 1, wherein determining parameters comprises:
providing a limit value;
comparing the limit value with an error signal that is derived from the digital baseband output signal and the sampled output signal; and
modifying the parameters if the limit value is exceeded in the previous step.

6. The method of claim 1, wherein determining parameters comprises:
setting up a Volterra series in order to represent the initial model;
developing Volterra cores in the Volterra series in the frequency domain by functions; and
transforming the Volterra cores to the time domain.

7. The method as claimed in claim 6, wherein one of the following functions is used for developing the Volterra cores: orthogonal polynomials, Legendre polynomials, Chebeyshev polynomials, Fourier series, radial base functions, and multiple layer perceptrons.

8. The method of claim 1, wherein the initial model is provided, and providing the initial model comprises:
providing the initial model comprising a linear dynamic initial filter and connected steady-state non-linearity for weighting of the signals which are emitted from the linear dynamic initial filter.

9. The method of claim 1, wherein generating the interpolated model comprises:
determining elements in the updated model which produce a time delay; and
varying the time delay in the determined elements of the updated model by a factor that is derived from the sampling frequency and the signal bandwidth of the input signal.

10. The method as claimed in claim 1, further comprising:
producing predistortion coefficients for distortion of the input signal, with the aid of the interpolated model.

11. A method for producing an interpolated model that is representative of an electrical network, comprising:
adapting an input signal to an output signal via an electrical network, wherein the input signal has an input signal bandwidth and the output signal has an output signal bandwidth; and
producing a sampled output signal by sampling the output signal at a frequency that is derived from the input signal bandwidth and is less than a value equal to twice the output signal bandwidth;
adapting a digital baseband input signal to a digital baseband output signal via an initial model of the electrical network, wherein the digital baseband signal is derived from the input signal;
comparing the digital baseband output signal with the sampled output signal and determining parameters to update said initial model to generate an updated model based on the comparison, wherein the determined parameters minimize an error between the digital baseband output signal output from the updated model and the sampled output signal; and
generating an interpolated model based on the updated model by performing an interpolation operation on the updated model, wherein the interpolated model is for correction of the low sampling rate and consideration of the signal components outside the useful signal spectrum in the output signal of the electrical network.

12. The method of claim 11, further comprising:
adapting a digital baseband signal to a digital baseband output signal via the updated model, wherein the digital baseband signal is derived from the input signal.

13. The method of claim 12, further comprising:
comparing the digital baseband output signal with the sampled output signal and determining parameters for the updated model therefrom.

14. A method of describing an electrical network via an interpolated model, comprising:
sampling an output signal of the electrical network at a sampling frequency, wherein the sampling frequency is derived from the signal bandwidth of an input signal of the electrical network and is less than twice the value of the output signal bandwidth; and
using the sampled output signal and the input signal to create the model, wherein the model is matched to the transmission response of the electrical network,
wherein creating the model comprises updating an initial model by comparing the sampled output signal to an output of the initial model and determining parameters for the updated model to minimize an error therefrom, and generating the interpolated model based on the updated model by performing an interpolation operation on the updated model, wherein the interpolated model is for correction of the low sampling rate and consideration of the signal components outside the useful signal spectrum in the output signal of the electrical network.

* * * * *